United States Patent [19]

Koleske

[11] Patent Number: 4,593,051

[45] Date of Patent: Jun. 3, 1986

[54] PHOTOCOPOLYMERIZABLE COMPOSITONS BASED ON EPOXY AND POLYMER/HYDROXYL-CONTAINING ORGANIC MATERIALS

[75] Inventor: Joseph V. Koleske, Charleston, W. Va.

[73] Assignee: Union Carbide Corporation, Danbury, Conn.

[21] Appl. No.: 464,563

[22] Filed: Feb. 7, 1983

[51] Int. Cl.$^4$ .............................. C08F 2/50; C08J 3/28
[52] U.S. Cl. .................................... 522/31; 427/54.1; 427/44; 522/77; 522/109; 522/126; 522/129; 522/130; 522/146; 522/170; 525/112; 525/118
[58] Field of Search ................... 525/107; 204/159.11, 204/159.14, 159.15

[56] References Cited

U.S. PATENT DOCUMENTS

| | | | |
|---|---|---|---|
| 3,304,273 | 2/1967 | Stamberger | 521/137 |
| 3,383,351 | 5/1968 | Stamberger | 521/137 |
| 3,417,045 | 12/1968 | Henson et al. | 525/107 |
| 3,523,093 | 8/1970 | Stamberger | 521/137 |
| 3,652,639 | 3/1972 | Pizzini et al. | 521/137 |
| 3,823,201 | 7/1974 | Pizzini et al. | 524/377 |
| 3,936,557 | 2/1976 | Watt | 204/159.11 |
| 4,173,476 | 11/1979 | Smith et al. | 430/280 |
| 4,218,531 | 8/1980 | Carlson | 430/280 |
| 4,231,951 | 11/1980 | Smith et al. | 260/446 |
| 4,246,319 | 1/1981 | Jacobone | 525/107 |
| 4,256,828 | 3/1981 | Smith | 430/280 |
| 4,275,190 | 6/1981 | Dudgeon | 525/122 |
| 4,294,746 | 10/1981 | Blair et al. | 525/122 |

FOREIGN PATENT DOCUMENTS

916246  1/1963  United Kingdom .

OTHER PUBLICATIONS

Copending U.S. Patent Application Ser. No. 369,835, filed Apr. 19, 1982 entitled "Photocopolymerizable Compositions Based on Epoxy and Hydroxyl-Containing Organic Materials", Joseph Victor Koleske.

Primary Examiner—John C. Bleutge
Assistant Examiner—Arthur H. Koeckert
Attorney, Agent, or Firm—Bernard Francis Crowe

[57] ABSTRACT

This invention is directed to photocopolymerizable compositions comprising an epoxide containing two or more epoxy groups, a polymer/poly (active hydrogen) organic compound and a photoinitiator. The cured coating compositions exhibit a clear appearance, good water resistance and can have utility as automotive finishes, can finishes, appliance finishes, general metal finishes, adhesives, printing inks, and the like.

23 Claims, No Drawings

PHOTOCOPOLYMERIZABLE COMPOSITONS BASED ON EPOXY AND POLYMER/HYDROXYL-CONTAINING ORGANIC MATERIALS

BRIEF SUMMARY OF THE INVENTION

1. Technical Field

This invention is directed in general to coating compositions and, in particular, to photocopolymerizable compositions comprising an epoxide containing two or more epoxy groups, a polymer/poly (active hydrogen) organic compound and a photoinitiator.

2. Background Art

In the field of radiation curable coatings, it is well known that coating compositions containing cycloaliphatic epoxides and hydroxyl-containing materials can be radiation cured by the use of onium salts such as FC-508 available from the 3M Company and UVE-1014 available from General Electric Company. The onium salts form shelf-stable formulations with cycloaliphatic epoxides and hydroxyl-containing materials in an environment free of ultraviolet light irradiation. When such onium salts are irradiated with ultraviolet light, a cationic catalyst composition is formed that cures the formulation into a coating film.

Many hydroxy-containing materials are described in the art as being useful ingredients in radiation curable cycloaliphatic epoxide systems. The particular hydroxyl-containing material selected as an ingredient in a radiation curable, epoxy-containing coating formulation can affect not only the properties of the cured coating but also the photcuring reaction itself. It is generally acknowledged in the art that basic molecules containing organic nitrogen can poison the cationic photocuring reaction and therefore their use should be avoided in all ultraviolet cured epoxy formulations (see UV Activated Epoxy Curative FC-508, 3M Commercial Chemicals Division, St. Paul, Minn., August, 1980).

Copending U.S. patent application Ser. No. 369,835, filed Apr. 19, 1982, discloses photocopolymerizable compositions comprising a cycloaliphatic epoxide, an alkylene oxide derived polyol having an average molecular weight of from about 2000 to about 4500, and a photoinitiator. These compositions are particularly suited for coating paper, wood, metal and plastic substrates.

U.S. Pat. No. 4,256,828 describes photocopolymerizable compositions which contain epoxides, organic material with hydroxyl functionality and a photosensitive aromatic sulfonium or iodonium salt of a halogen-containing complex ion. The organic material with hydroxyl functionality is described in the patent beginning at column 4, line 54 and extending through column 6, line 63.

U.S. Pat. No. 4,231,951 also describes photocopolymerizable compositions which contain cycloaliphatic epoxides, organic materials having hydroxyl functionality and a triarylsulfonium complex salt photoinitiator. The organic material with hydroxyl functionality is described in the patent beginning at column 3, line 67 and extending through column 5, line 47.

U.S. Pat. No. 4,173,476 describes photocopolymerizable compositions which contain epoxides, organic materials with hydroxyl functionality and a triarylsulfonium complex salt photoinitiator. The organic material with hydroxyl functionality is described in the patent beginning at column 3, line 62 and extending through column 5, line 42.

U.S. Pat. No. 4,218,531 describes the use of certain organic materials having non-aromatic carbon-carbon unsaturation in connection with photocopolymerizable compositions containing aromatic sulfonium complex salt photoinitiators in order to minimize or eliminate the odor of organosulfur reaction by-products. The photocopolymerizable compositions also contain epoxides and hydroxy-containing organic materials. The hydroxyl-containing organic materials are described in the patent beginning at column 3, line 16 and extending through column 5, line 25.

However, none of the above references and no prior art is currently known which discloses or teaches the benefical use of polymer/poly (active hydrogen) organic compounds in photocopolymerizable coating compositions based on epoxy and hydroxyl-containing organic materials.

It has been unexpectedly found as a result of the present invention that photocopolymerizable coating compositions based on epoxy and hydroxyl-containing organic materials, in which the hydroxyl-containing organic materials are polymer/poly (active hydrogen) organic compounds such as polymerized acrylonitrile or polymerized acrylonitrile and styrene dispersed in an organic polyol, cure very well without any apparent poisoning of the photocuring reaction. The cured coating films of this invention exhibit a clear appearance even though the polymer/poly (active hydrogen) organic compounds in general have an opaque appearance. The cured coating films of this invention also exhibit good water resistance with no thermal post cure and other highly desirable film properties as described more fully hereinbelow.

DISCLOSURE OF THE INVENTION

The present invention is directed to photocopolymerizable compositions comprising an epoxide containing two or more epoxy groups, a polymer/poly (active hydrogen) organic compound and a photoinitiator. The invention is also directed to blend formulations comprising an epoxide containing two or more epoxy groups and a polymer/poly(active hydrogen) organic compound. The above compositions can optionally contain a reactive diluent such as a substituted cycloaliphatic monoepoxide, i.e., 4-vinyl cyclohexene monoepoxide, a surfactant, fillers, additives and an organic solvent where necessary. The photocopolymerizable coating compositions of the present invention based on epoxy and polymer/hydroxyl-containing organic materials, in which the polymer/hydroxyl-containing organic materials are polymer/poly (active hydrogen) organic compounds such as polymerized acrylonitrile or polymerized acrylonitrile and styrene dispersed in an organic polyol, cure very well without any apparent poisoning of the photocuring reaction as suggested in the prior art. The cured coating films of this invention exhibit a clear appearance even though the polymer/poly (active hydrogen) organic compounds in general have an opaque appearance. The cured coating films of this invention also exhibit good water resistance with no thermal post cure and other highly desirable film properties as described more fully hereinbelow. The cured coating films are particularly suited for coating paper, wood, metal and plastic substrates, in particular, automotive finishes, can finishes, appliance finishes, business machine finishes, coil coating, house siding, general metal finishes, adhesives, printing inks and the like.

The invention is further directed to a process for preparing a cured film coating comprising: (1) mixing until homogeneous a photocopolymerizable composition comprising an epoxide containing two or more epoxy groups, a polymer/poly (active hydrogen) organic compound, and a photoinitiator; (2) applying the homogeneous photocopolymerizable composition as a film coating on a suitable surface or substrate; and (3) exposing the film coating to actinic irradiation at a wavelength within the ultraviolet and visible spectral regions or electron beam irradiation for a period of time sufficient to cure the film coating. The cured film prepared by the above described process is also a part of this invention.

In copending U.S. patent application Ser. No. 464,571, filed on an even data herewith, there is described photocopolymerizable compositions comprising an epoxide containing two or more epoxy groups, a poly (active hydrogen) organic compound, a photoinitiator, and, as a reactive diluent, a substituted cycloaliphatic monoepoxide. The photocopolymerizable compositions have desirably low viscosity and can be applied in a conventional manner such as roll coating, spray and the like and, after being cured to dry coating films, can have utility as automotive finishes, appliance finishes, general metal finishes and the like.

Copending U.S. patent application Ser. No. 464,568, filed on an even data herewith, describes photocopolymerizable compositions comprising a poly (active hydrogen) organic compound, a photoinitiator and, as a reactive diluent, a substituted cycloaliphatic monoepoxide. The photocopolymerizable compositions have low viscosity and can be applied to suitable substrates by conventional methods and, after curing, provide excellent pressure sensitive and heat-activated adhesive coatings.

Copending U.S. patent application Ser. No. 464,580, filed on an even data herewith, describes photocopolymerizable compositions comprising an epoxide containing two or more epoxy groups, a poly (active hydrogen) organic compound having at least some primary hydroxy content and a photoinitiator. The cured coating compositions exhibit fast cure rates, good water resistance and can have utility as automotive finishes, appliance finishes, general metal finishing and the like.

In copending U.S. patent application Ser. No. 464,564, filed on an even data herewith, there is described photocopolymerizable compositions comprising an epoxide containing two or more epoxy groups, a photoinitiator and, as a reactive diluent, a substituted cycoaliphatic monoepoxide. The photocopolymerizable compositions have desirably low viscosity and can be applied to a suitable substrate in a conventional manner such as roll coating, spray and the like. The cured coatings are suitable for use in a variety of applications in the fields of protective coatings and graphic arts.

Copending U.S. patent application Ser. No. 464,570, now abandoned filed on an even data herewith, describes photocopolymerizable compositions comprising a photoinitiator selected from diazonium salts, onium salts and mixtures thereof and, as a reactive diluent, a cycloaliphatic epoxide. The photocopolymerizable compositions have desirably low viscosity and can be applied to suitable substrates by conventional methods.

In copending U.S. patent application Ser. No. 464,558, filed on an even data herewith, there is described photocopolymerizable compositions comprising an epoxide containing two or more epoxy groups, a poly (active hydrogen) organic compound and a hydroxyl substituted cycloaliphatic monoepoxide. The photocopolymerizable compositions can be cured into coatings which have improved water resistance.

DETAILED DESCRIPTION

The epoxides which may be used herein contain two or more epoxy groups having the formula:

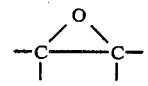

and have a viscosity of about 200, or higher, centipoise at 25° C. The epoxy groups can be terminal epoxy groups or internal epoxy groups. The epoxides are primarily cycloaliphatic epoxides. These cycloaliphatic epoxide resins may be blended with minor amounts of glycidyl type epoxides, aliphatic epoxides, epoxy cresol novolac resins, epoxy phenol novolac resins, polynuclear phenol-glycidyl ether-derived resins, aromatic and heterocyclic glycidyl amine resins, hydantoin epoxy resins, and the like, and mixtures thereof. These epoxides are well known in the art and many are commercially available.

Suitable cycloaliphatic epoxide resins for purposes of this invention are those having an average of two or more epoxy groups per molecule. Illustrative of suitable cycloaliphatic epoxides are the following:

FORMULA 1

Diepoxides of cycloaliphatic esters of dicarboxylic acids having the formula:

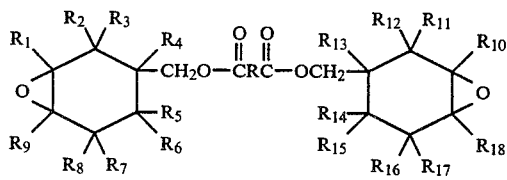

wherein $R_1$ through $R_{18}$, which can be the same or different, are hydrogen or alkyl radicals generally containing one to nine carbon atoms inclusive, and preferably containing one to three carbon atoms, inclusive, as for example methyl, ethyl, n-propyl, n-butyl, n-hexyl, 2-ethylhexyl, n-octyl, n-nonyl and the like; R is a valence bond or a divalent hydrocarbon radical generally containing one to twenty carbon atoms, inclusive, and preferably, containing four to six carbon atoms, inclusive, as for example, alkylene radicals, such as trimethylene, tetramethylene, pentamethylene, hexamethylene, 2-ethylhexamethylene, octamethylene, nonamethylene, hexadecamethylene, and the like; cycloaliphatic radicals, such as 1,4-cyclohexane, 1,3-cyclohexane, 1,2-cyclohexane, and the like.

Particularly desirable epoxides, falling within the scope of Formula I, are those wherein $R_1$ through $R_{18}$ are hydrogen and R is alkylene containing four to six carbon atoms.

Among specific diepoxides of cycloaliphatic esters of dicarboxylic acids are the following:
bis(3,4-epoxycyclohexylmethyl)oxalate,
bis(3,4-epoxycyclohexylmethyl)adipate, bis(3,4-epoxy-6-methylcyclohexylmethyl)adipate, bis(3,4-epoxycyclohexylmethyl)pimelate, and the like.

Other suitable compounds are described in, for example, U.S. Pat. No. 2,750,395.

FORMULA II

A 3,4-epoxycyclohexylmethyl-3,4-epoxycyclohexane carboxylate having the formula:

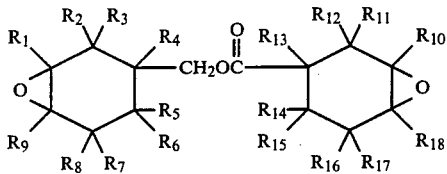

wherein $R^1$ through $R^{18}$ which can be the same or different are as defined for $R_1$ through $R_{18}$ in Formula I. Particularly desirable compounds are those wherein $R^1$ through $R^{18}$ are hydrogen.

Among specific compounds falling within the scope of Formula II are the following: 3,4-epoxycyclohexylmethyl-3,4-epoxycyclohexane carboxylate; 3,4-epoxy-1-methylcyclohexylmethyl-3,4-epoxy-1-methylcyclohexane carboxylate; 6-methyl-3,4-epoxycyclohexylmethyl-6-methyl-3,4-epoxycyclohexane carboxylate; 3,4-epoxy-3-methylcyclohexylmethyl-3,4-epoxy-3-methylcyclohexane carboxylate; 3,4-epoxy-5-methylcyclohexylmethyl-3,4-epoxy-5-methylcyclohexane carboxylate. Other suitable compounds are described in, for example, U.S. Pat. No. 2,890,194.

FORMULA III

Diepoxides having the formula:

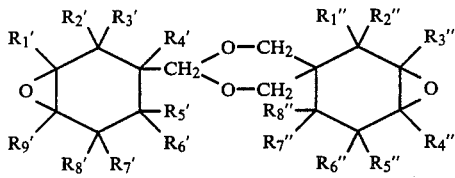

wherein the R single and double primes, which can be the same or different, are monovalent substituents such as hydrogen, halogen, i.e. chlorine, bromine, iodine or fluorine, or monovalent hydrocarbon radicals, or radicals as further defined in U.S. Pat. No. 3,318,822. Particularly, desirable compounds are those wherein all the R's are hydrogen.

Other suitable cycloaliphatic epoxides are the following:

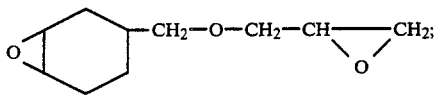

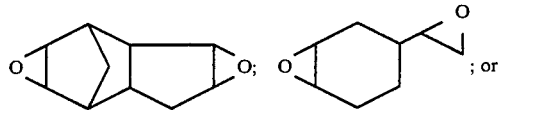

and the like.

The preferred cycloaliphatic epoxides are the following:

3,4-Epoxycyclohexylmethyl-3,4-Epoxycyclohexane carboxylate

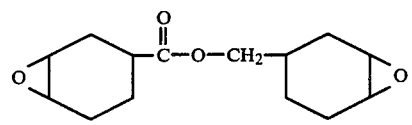

Bis(3,4-Epoxycyclohexylmethyl)adipate

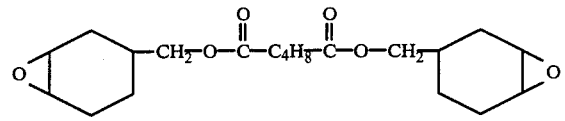

2-(3,4-Epoxycyclohexyl-5,5-spiro-3,4-epoxy)cyclohexane-meta-dioxane

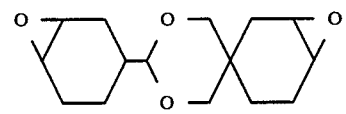

or mixtures thereof.

Epoxides with six membered ring structures may also be used, such as diglycidyl esters of phthalic acid, partially hydrogenated phthalic acid or fully hydrogenated acid, the diglycidyl esters of hexahydrophthalic acids being preferred. A representative diglycidyl ester of phthalic acid is the following:

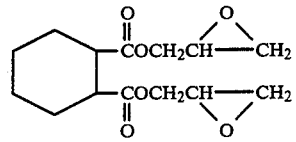

The glycidyl-type epoxies are preferably diglycidyl ethers of bisphenol A which are derived from bisphenol A and epichlorohydrin and have the following formula:

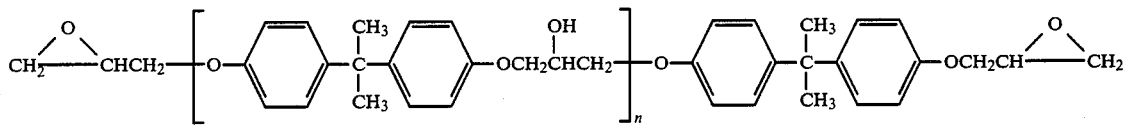

The cresol-novolac epoxy resins are multifunctional, solid polymers characterized by low ionic and hydrolyzable chlorine impurities, high chemical resistance, and thermal performance.

The epoxy phenol novolac resins are generally of the following formula:

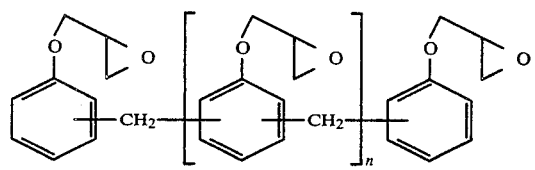

The polynuclear phenol-glycidyl ether-derived resins are generally of the formula:

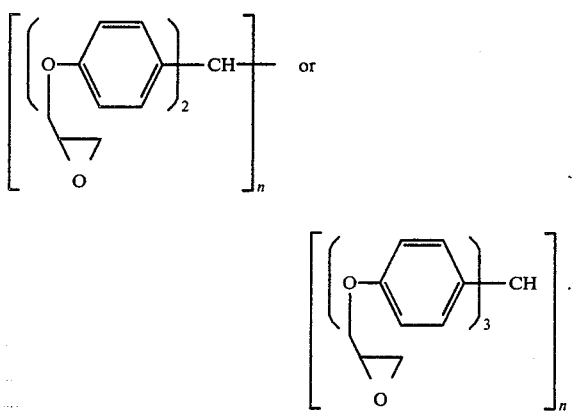

Among the aromatic and heterocyclic glycidyl amine resins which may be included herein are the following: tetraglycidylmethylenedianiline derived resins of the following formula:

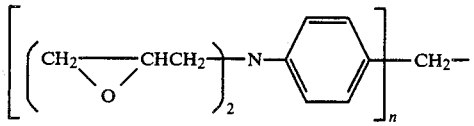

Triglycidyl-p-aminophenol derived resins, triazine based resins and hydantoin epoxy resins of the formula:

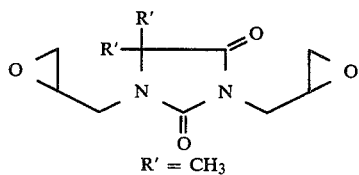

It is of course understood by those skilled in the art that when a photoinitiator is used, only minor amounts of basic organic nitrogen-containing epoxide compounds may be used so as not to interfere with the photocopolymerization reaction.

The concentration of the epoxides in the photocopolymerizable and blend compositions of this invention can range from about 1 to about 95 weight percent, preferably from 25 to 90 weight percent, and most preferably from 50 to 80 weight percent of the total weight of the coating composition depending upon the desired properties in the cured compositions. The ratio of the equivalent weight of epoxide to the total hydroxyl equivalent weight of the polymer/poly (active hydrogen) organic compound can range from about 120:1 to about 1:1, preferably from about 110:1 to about 5:1, and most preferably from about 100:1 to about 10:1 depending upon the properties desired in the cured compositions. The preferred epoxides for use in the coating compositions of this invention are described in copending U.S. patent application Ser. No. 464,564, filed on an even date herewith.

The polymer/poly (active hydrogen) organic compound that is blended with the epoxide containing two or more epoxy groups to produce the coating compositions of this invention include any compatible organic compound containing two or more active hydrogen atoms per molecule with a polymer dispersed therein. The polymer/poly (active hydrogen) organic compounds are well known to those skilled in the art and include, for example, polymer/polyols and the like.

The polymer/polyols that can be used to prepare the coating compositions of this invention are known materials. Such polymer/polyols can be produced in situ by polymerizing one or more ethylenically unsaturated monomers dissolved or dispersed in a base polyol in the presence of a free radical catalyst. The production of polymer/polyols is more fully described in, for example, U.S. Pat. No. Re. 28,715, U.S. Pat. No. Re. 29,118, U.S. Pat. No. 3,652,639, U.S. Pat. No. Re. 29,014, U.S. Pat. No. 3,950,317, U.S. Pat. No. 4,208,314, U.S. Pat. No. 4,104,236, U.S. Pat. No. 4,172,825 and U.S. Pat. No. 4,198,488.

Substantially any of the polyether polyols previously used in the art to make polymer/polyols can be used in this invention. Illustrative of the polyether polyols useful in producing polymer/polyol compositions are the polyhydroxyalkanes, the polyoxyalkylene polyols, or the like. Among the polyether polyols which can be employed are those selected from one or more of the following classes of compositions, alone or in admixture, known to those skilled in the art:

(a) Alkylene oxide adducts of polyhydroxyalkanes;

(b) Alkylene oxide adducts of non-reducing sugars and sugar derivatives;

(c) Alkylene oxide adducts of phosphorus and polyphosphorus acids;

(d) Alkylene oxide adducts of polyphenols;

(e) The polyols from natural oils such as castor oil, and the like.

Illustrative alkylene oxide adducts of polyhydroxyalkanes include, among others, the alkylene oxide adducts of ethylene glycol, propylene glycol, 1,3-dihydroxypropane, 1,3-dihydroxybutane, 1,4-dihydroxybutane, 1,4-, 1,5-, and 1,6-dihydroxyhexane, 1,2-, 1,3-, 1,4-, 1,6-, and 1,8-dihydroxyoctane, 1,10-dihydroxydecane, glycerol, 1,2,4-trihydroxybutane, 1,2,6-trihydroxyhexane, 1,1,1-trimethylolethane, 1,1,1-trimethylolpropane, pentaerythritol, polycaprolactone, xylitol, arabitol, sorbitol, mannitol, and the like. A preferred class of alkylene oxide adducts of polyhydroxyalkanes are the ethylene oxide, propylene oxide, butylene oxide, or mixtures thereof, adducts of trihydroxyalkanes.

A further class of polyether polyols which can be employed are the alkylene oxide adducts of the non-reducing sugars, wherein the alkylene oxides have from 2 to 4 carbon atoms. Among the non-reducing sugars and sugar derivatives contemplated are sucrose, alkyl glycosides such as methyl glucoside, ethyl glucoside, and the like, glycol glycosides such as ethylene glycol glucoside, propylene glycol glucoside, glycerol glucoside, 1,2,6-hexanetriol glucoside, and the like, as well as the alkylene oxide adducts of the alkyl glycosides as set forth in U.S. Pat. No. 3,073,788.

A still further useful class of polyether polyols is the polyphenols, and preferably the alkylene oxide adducts thereof wherein the alkylene oxides have from 2 to 4 carbon atoms. Among the polyphenols which are contemplated are, for example, bisphenol A, bisphenol F, condensation products of phenol and formaldehyde, the novolac resins, condensation products of various phenolic compounds and acrolein; the simplest member of this class being the 1,1,3-tris(hydroxyphenyl)propanes, condensation products of various phenolic compounds and glyoxal, glutaraldehyde, and other dialdehydes, the simplest members of this class being the 1,1,2,2,-tetrakis(hydroxyphenol)ethanes, and the like.

The alkylene oxide adducts of phosphorus and polyphosphorus acids are another useful class of polyether polyols. Ethylene oxide, 1,2-epoxypropane, the epoxybutanes, 3-chloro-1,2-epoxypropane, and the like are preferred alkylene oxides. Phosphoric acid, phosphorus acid, the polyphosphoric acids such as tripolyphosphoric acid, the polymetaphosphoric acids, and the like are desirable for use in this connection.

The polyether polyols employed can have hydroxyl numbers which vary over a wide range. In general, the hydroxyl numbers of the polyols employed in the invention can range from about 15, and lower, to about 900, and higher. The hydroxyl number is defined as the number of milligrams of potassium hydroxide required for the complete neutralization of the fully phthalated derivative prepared from 1 gram of polyol. The hydroxyl number can also be defined by the equation:

$$OH = \frac{56.1 \times 1000 \times f}{m.w.}$$

where

OH = hydroxyl number of the polyol;
f = functionality, that is, average number of hydroxyl groups per molecule of polyol; and
m.w. = molecular weight of the polyol.

The most preferred polyether polyols include ethylene glycol, diethyleneglycol, the poly(oxypropylene)-glycols, triols and higher functionality polyols. These polyols also include poly(oxypropylene-oxyethylene)-polyols; however, desirably, the oxyethylene content should comprise less than 80 percent of the total and preferably less than 60 percent. The ethylene oxide when used can be incorporated in any fashion along the polymer chain. Stated another way, the ethylene oxide can be incorporated either in internal blocks, as terminal blocks, or may be randomly distributed along the polymer chain. As is well known in the art, the polyols that are most preferred herein contain varying small amounts of unsaturation. Unsaturation in itself does not affect in any adverse way the formation of the coating compositions in accordance with the present invention. It should be appreciated that a blend or mixture of more than one base polyol can be utilized, if desired, to form the polymer/polyol.

The polymerizable ethylenically unsaturated monomers which can be used in this invention to form the polymer/polyol compositions include the polymerizable ethylenically unsaturated hydrocarbon monomers and polymerizable ethylenically unsaturated organic monomers, the molecules of which are composed of carbon, hydrogen and at least one of halogen, O, S, or N. The monomers useful in the process of this invention are the polymerizable monomers characterized by the presence therein of at least one polymerizable ethylenic unsaturated group of the type C=C. The monomers can be used singly or in combination to produce homopolymer/polyol or copolymer/polymer reactive compositions.

These monomers are well known in the art and include the hydrocarbon monomers such as butadiene, isoprene, 1,4-pentadiene, 1,6-hexadiene, 1,7-octadiene, styrene, alpha-methylstyrene, methylstyrene, 2,4-dimethylstyrene, ethylstyrene, isopropylstyrene, butylstyrene, phenylstyrene, cyclohexylstyrene, benzylstyrene, and the like, substituted styrenes such as cyanostyrene, nitrostyrene, N,N-dimethylaminostyrene, acetoxystyrene, methyl 4-vinylbenzoate, phenoxystyrene, p-vinyl diphenyl sulfide, p-vinylphenyl phenyl oxide, and the like; the acrylic and substituted acrylic monomers such as acrylic acid, methacrylic acid, methyl acrylate, 2-hydroxyethyl acrylate, 2-hydroxyethyl methacrylate, methyl methacrylate, cyclohexyl methacrylate, benzyl methacrylate, isopropyl methacrylate, octyl methacrylate, methacrylonitrile, ethyl alpha-ethoxyacrylate, methyl alpha-acetaminoacrylate, butyl acrylate, 2-ethylhexyl acrylate, phenyl acrylate, phenyl methacrylate, N,N-dimethylacrylamide, N,N-dibenzylacrylamide, N-butylacrylamide, methacrylyl formamide, acrylonitrile, and the like; vinylidene chloride; the vinyl esters, vinyl ethers, vinyl ketones, etc., such as vinyl acetate, vinyl alcohol, vinyl butyrate, isopropenyl acetate, vinyl formate, vinyl acrylate, vinyl methacrylate, vinyl methoxy acetate, vinyl benzoate, vinyl toluene, vinyl naphthalene, vinyl methyl ether, vinyl ethyl ether, vinyl propyl ethers, vinyl butyl ethers, vinyl 2-ethylhexyl ether, vinyl phenyl ether, vinyl 2-methoxyethyl ether, methoxybutadiene, vinyl 2-butoxyethyl ether, 3,4-dihydro-1,2-pyran, 2-butoxy-2'-vinyloxy diethyl ether, vinyl 2-ethylmercaptoethyl ether, vinyl methyl ketone, vinyl ethyl ketone, vinyl phenyl ketone, vinyl ethyl sulfide, vinyl ethyl sulfone, N-methyl-N-vinyl acetamide, N-vinyl-pyrrolidone, vinyl imidazole, divinyl sulfide, divinyl sulfoxide, divinyl sulfone, sodium vinyl sulfonate, methyl vinyl sulfonate, N-vinyl pyrrole, and the like; dimethyl fumarate, dimethyl maleate, maleic acid, crotonic acid, fumaric acid, itaconic acid, monomethyl itaconate, t-butylaminoethyl methacrylate, dimethylaminoethyl methacrylate, glycidyl acrylate, allyl alcohol, glycol monoesters of itaconic acid, vinyl pyridine, and the like. Any of the known polymerizable monomers can be used and the compounds listed above are illustrative and not restrictive of the monomers suitable for use in this invention. Any of the known chain transfer agents can be present if desired.

The preferred monomer used to make the polymers of the polymer/polyol compositions is acrylonitrile alone as a homopolymer or in combination with styrene as a copolymer. The relative weight proportions of acrylonitrile to styrene illustratively range from about 0:100 to about 100:0 preferably from about 20:80 to about 100:0, more preferably about 25:75 to about 100:0, and when low molecular weight polyols, e.g., below about 200, are used as the base polyol, then the weight ratio should be from about 40:60 to about 85:15. Terpolymers of acrylonitrile, methyl methacrylate, and styrene have also been employed.

The polymer and polyol content of the polymer/polyols can vary within wide limits, depending upon the requirements of the anticipated end use application. In general, the polymer content will vary from about 10 to about 50 percent, based upon the weight of the polymer/polyol. The polyol content of the polymer/polyols varies from about 50 to about 90 percent, based upon the weight of the polymer/polyol.

Catalysts useful in producing the polymer/polyol compositions are the free radical type of vinyl polymerization catalysts such as the peroxides, persulfates, perborates, percarbonates and the azo compounds or any other suitable catalyst specified in the above-mentioned patents. Illustrative of a few such catalysts are 2,2'-azobis-isobutyronitrile, dibenzoyl peroxide, lauroyl peroxide, di-t-butyl peroxide, diisopropyl peroxide carbonate, t-butyl peroxy-2-ethylhexanoate, t-butylperpivalate, 2,5-dimethyl-hexane-2,5-diper-2-ethyl hexoate, t-butylperneodecanoate, t-butylperbenzoate, t-butylpercrotonate, t-butyl periosbutyrate, di-t-butyl perphthalate and the like. Azo bis(isobutyronitrile) is the preferred catalyst since it does not impart any objectionable product odor or require special handling in the plant because of possible hazards. The peroxy catalysts are also preferred for the manufacture of the polymer/polyols.

The catalyst concentration is not critical and can be varied within wide limits. As a representative range in forming the polymer/polyol compositions, the concentration can vary from about 0.1 to about 5.0 weight percent, based upon the total feed to the reactor. Up to a certain point, increases in the catalyst concentration result in increased monomer conversion but further increases do not substantially increase conversion. On the other hand, increasing catalyst concentration increasingly improves product stability. The catalyst concentration selected will usually be an optimum value considering all factors, including costs.

The polymerization to form the polymer/polyol compositions can also be carried out with an inert organic solvent present that does not dissolve the polymer, although solvents are not essential. Illustrative of suitable solvents are toluene, benzene, and the like, including those known in the art as being suitable solvents for the polymerization of vinyl monomers. The only requirement in the selection of the solvent and the polyol is that they do not interfere with the monomer's polymerization reaction. When an inert organic solvent is used, it is generally removed from the reaction mixture by conventional means before the polymer/polyol compositions are used to produce coating compositions.

The temperature range used in producing the polymer/polyol composition is not narrowly critical and may vary from about 80° C. or less to about 150° C. or perhaps greater, the preferred range being from 105° C. to 135° C. The catalyst and temperature should be selected so that the catalyst has a reasonable rate of decomposition with respect to the hold-up time in the reactor for a continuous flow reactor or the feed time for a semi-batch reactor.

The preferred process used in producing the polymer/polyol compositions involves polymerizing the monomers in the polyol while maintaining a low monomer to polyol blend ratio throughout the reaction mixture during the polymerization. This provides in the preferred case polymer/polyol compositions in which essentially all of the polymer particles have diameters of less than 30 microns and generally less than one micron. Such low ratios are achieved by employing process conditions that provide rapid conversion of monomer to polymer. In practice, a low monomer to polyol blend ratio is maintained, in the case of semi-batch and continuous operation, by control of the temperature and mixing conditions and, in the case of semi-batch operation, also by slowly adding the monomers to the polyol. The process can be carried out in various manners such as by a semi-batch reactor, a continuous backmixed stirred tank reactor, etc. For the latter, a second stage may be used to incrementally increase the conversion of monomers. The mixing conditions employed are those attained using a back-mixed reactor (e.g. a stirred flask or stirred autoclave). Such reactors keep the reaction mixture relatively homogeneous and so prevent localized high monomer to polyol ratios such as occur in certain tubular reactors (e.g., in the first stages of "Marco" reactors when such reactors are operated conventionally with all the monomer added to the first stage).

When using a semi-batch process, the feed times can be varied (as well as the proportion of polyol in the reactor at the start versus polyol fed with the monomer) to effect changes in the product viscosity. Generally, longer feed times result in higher product viscosities and may allow use of slightly broader acrylonitrile to styrene ranges for a given polyol and polymer content.

The production of polymer/polyols suitable for use in the coating compositions of this invention is more fully described in the patents identified hereinabove. Preferred commercial polymer/polyols for use in this invention include among others a polymer/polyol based on a propylene oxide polyol that contains 10 percent acrylonitrile in a dispersed solid phase commercially available from Union Carbide Corporation as NIAX Polymer Polyol 31-23, and a polymer/polyol based on a propylene oxide polyol that contains 21 percent of a styrene/acrylonitrile copolymer in a dispersed solid phase commercially available from Union Carbide Corporation as NIAX Polymer Polyol 34-28.

The concentration of the polymer/poly(active hydrogen) organic compound in the photocopolymerizable and blend compositions of this invention can range from about 1 to about 60 weight percent, preferably from 5 to 40 weight percent, and most preferably from 10 to 30 weight percent of the total weight of the coating composition depending upon the properties desired in the cured compositions. The ratio of the equivalent weight of epoxide to the total hydroxyl equivalent weight of polyol can range from about 120:1 to about 1:1, preferably from about 110:1 to about 5:1, and most preferably from about 100:1 to about 10:1 depending upon the properties desired in the cured compositions.

The polymer/poly(active hydrogen) organic compounds utilized in the coating compositions of this invention can be mixtures or blends of at least two different polymer/poly(active hydrogen) organic compounds or mixtures or blends of a polymer/poly(active hydrogen) organic compound with at least one other poly(active hydrogen) organic compound, i.e., organic polyol. Suitable organic polyols which can be mixed or blended with the polymer/poly(active hydrogen) organic compound include polyether polyols as described hereinabove, polyester polyols, polycaprolactone polyols, acrylic and vinyl polyols, polyether polyols capped with ethylene oxide and the like. It is appreciated that the suitable organic polyols should be present in minor amounts in the blend or mixture compositions so as to not negate the benefits of the polymer/poly(active hydrogen) organic compound employed in the coating compositions of this invention. Other mixtures or blends may similarly be used if desired. The suitable blended or mixed organic polyols should be present in amounts less than 50 weight percent, preferably less than 25 weight percent, of the total polymer/poly(active hydrogen) organic compound concentration in the coating composition.

The preferred classes of suitable blended or mixed organic polyols employed in minor amounts in the coating compositions of this invention are the polycaprolactone polyols such as TONE-0200 and TONE-0305 commercially available from Union Carbide Corporation, the dihydroxy functional polytetramethylene oxide polyols such as Polymeg 650, 1000 and 2000 commercially available from Quaker Oats Company, polyether polyols capped with ethylene oxide such as propylene oxide polyols capped with ethylene oxide, e.g., E-480, E-474, NIAX Polyol 11-27 and NIAX Polyol 11-34 commercially available from Union Carbide Corporation, and of course the ethylene oxide and propylene oxide adducts including ethylene glycol, diethylene glycol, the poly(oxyethylene)glycols, the poly(oxypropylene)glycols, triols and higher functionality polyols such as LHT-67, LHT-112 and LG-56 commercially available from Union Carbide Corporation. These polyols also include poly(oxypropylene-oxyethylene)-polyols; however, desirably, the oxyethylene content should comprise less than 80 percent of the total and preferably less than 60 percent. The ethylene oxide when used can be incorporated as internal blocks along the polymer chain. As is well known in the art, the polyols that are preferred herein contain varying small amounts of unsaturation. Unsaturation in itself does not affect in any adverse way the formation of the coating compositions in accordance with the present invention.

Other preferred representative examples of suitable blended or mixed organic polyols that may be employed in minor amounts in the coating compositions of this invention include copolymers of hydroxypropyl and hydroxyethyl acrylates and methacrylates with other free radical-polymerizable monomers such as acrylate esters, vinyl halides, vinyl acetate, or styrene; copolymers containing pendent hydroxy groups formed by hydrolysis or partial hydrolysis of vinyl acetate copolymers, polyvinylacetal resins containing pendent hydroxyl groups; modified cellulose polymers such as hydroxyethylated and hydroxypropylated cellulose; hydroxy terminated polyesters and hydroxy terminated polyalkadienes. The polyester polyols are the reaction products of polyfunctional organic carboxylic acids and polyhydric alcohols and include, for example, poly(hexamethylene adipate), poly(ethylene adipate), poly(butylene adipate) and the like. Many of these organic polyols can be prepared by conventional methods and are commercially available from a number of manufacturers such as polyvinylacetal resins commercially available from Monsanto Chemical Company as Butvar B-72A, B-73, B-76, B-90 and B-98 and as Formvar 7/70, 12/85, 7/95S, 7/95E, 15/95S and 15/95E; an aliphatic polyester diol commercially available from Rohm and Haas as Paraplex U-148; saturated polyester polyols commercially available from Mobay Chemical Company as Multron R-2, R-12A, R-16, R-18, R-38, R-68, and R-74; a hydroxypropylated cellulose having an equivalent weight of approximately 100 commercially available from Hercules, Inc. as Klucel E, and a cellulose acetate butyrate ester having a hydroxyl equivalent weight of approximately 400 commercially available from Eastman Kodak as Alcohol Soluble Butyrate.

The photoinitiator suitable for use in the coating compositions of this invention may be any one of the well known photoinitiators such as described in, for example, U.S. Pat. Nos. 4,231,951; 4,256,828; 4,138,255 and 4,058,401, which patents are incorporated herein by reference. Preferred photoinitiators include triarylsulfonium complex salts as described in U.S. Pat. No. 4,231,951, aromatic sulfonium or iodonium salts of halogen-containing complex ions as described in U.S. Pat. No. 4,256,828; aromatic onium salts of Group VIa elements as described in U.S. Pat. Nos. 4,058,401 and 4,138,255; aromatic onium salts of Group Va elements as described in U.S. Pat. No. 4,069,055. Such salts are commercially available as FC-508 and FC-509 (available from Minnesota Mining and Manufacturing Company), and as UVE-1014 (available from General Electric Company). Other preferred photoinitiators for use in the coating compositions of this invention are described more fully in copending U.S. patent application Ser. No. 464,570, filed on an even date herewith. The photoinitiators are used in conventional amounts such as from about 0.1 to 30 parts by weight per 100 parts by weight of the combination of cycloaliphatic epoxide and the polymer/poly(active hydrogen) organic compound.

The photocopolymerizable coating compositions of this invention may optionally include a substituted cycloaliphatic monoepoxide as a reactive diluent therein. The use of a substituted cycloaliphatic monoepoxide as a reactive diluent in photocopolymerizable compositions based on epoxy and hydroxyl-containing organic materials is more fully described in copending U.S. patent application Ser. No. 464,571, filed on an even date herewith.

The substituted cycloaliphatic monoepoxide can be substituted with alkyl of 1 to 9 carbon atoms, halogen, oxygen, ether, ester or vinyl radicals. Preferably, the substituted cycloaliphatic monoepoxide is vinyl substituted cycloaliphatic monoepoxide and is preferably selected from one or more of the following:

(1) 4-vinyl cyclohexene monoepoxide having the formula:

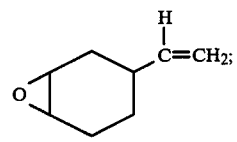

(2) norbornene monoepoxide having the formula:

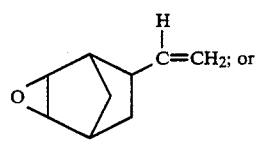

(3) limonene monoepoxide having the formula:

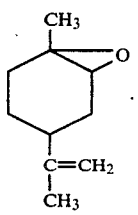

The substituted cycloaliphatic monoepoxide acts as a reactive diluent that cures into the final coating product, has a marked effect in lowering viscosity, is not volatilized during the radiation cure operation and does not retard the curing rate.

The substituted cycloaliphatic monoepoxide can be used in the coating compositions in amounts of from about 0.1 to about 95, preferably from about 1 to about 60, and most preferably, from about 3 to about 30 weight percent.

The coating compositions may preferably include additives in conventional quantities such as oils, particularly silicone oil, surfactants such as silicone-alkylene oxide copolymers e.g., L-5410 commercially available from Union Carbide Corporation, silicone oil containing aliphatic epoxide groups, fluorocarbon surfactants such as FC-171 commercially available from the 3M Company and FC-430 also commercially available from the 3M Company; low molecular weight alcohols such as RJ-100 commercially available from Monsanto Chemical Company; cellosolves, such as butyl CELLOSOLVE commercially available from Union Carbide Corporation; carbitols, such as butyl CARBITOL; diethyleneglycol; low molecular weight hydroxyl-containing vinyl polymers such as UCAR Solution Vinyl VYES commercially available from Union Carbide Corporation; glycidyl ether monomers of the formula:

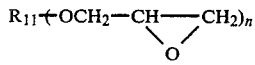

wherein $R_{11}$ is alkyl or aryl and n is an integer of 1 to 6. Examples are glycidyl ethers of polyhydric phenols obtained by reacting a polyhydric phenol with an excess of chlorohydrin such as epichlorohydrin. Further examples of this type are described in, for example, U.S. Pat. No. 3,018,262; alpha olefin epoxides; epoxy novolaks, and the like. If desired, one may also include in the coating compositions various conventional non-basic fillers (e.g., silica, talc, glass beads and bubbles, clays, powdered metal such as aluminum, zinc oxide, etc.) up to about 50% by volume or more, viscosity modifiers, rubbers, tackifying agents, pigments, and so forth. The particular additives or fillers selected are of no consequence to the basic invention.

In preparing the coating compositions, the ingredients are mixed by conventional procedures used in the production of inks, paints and coating compositions. These procedures are so well known to those skilled in the art that they do not require further discussion here. However, it should be noted that when the photoinitiator is incorporated into the coating compositions, it is necessary that the curable coating formulation be mixed or blended under "safe light" such as a yellow light source to obviate or minimize photopolymerization. The coating compositions can also contain an organic solvent as an optional component. Any of the conventional solvents used in the coatings industry can be used at a concentration preferably below 30 weight percent of the total weight of the coating composition. Suitable solvents are acetone, methylene chloride and any solvent that does not react appreciably with the the epoxide containing two or more epoxy groups and the photoinitiator. While larger amounts of solvent could conceivably be used, the use of larger amounts would negate the benefits of radiation curable coating which are considered to be essentially 100% solids coating systems. The solvents are generally added in the small amounts indicated to improve flowability during application of the coating composition to the substrate.

The curable coating compositions of this invention are applied to a suitable surface or substrate by conventional means such as roll coating or spray. Curing or photopolymerization of the coating compositions occurs on exposure of the compositions to any source of radiation emitting actinic radiation at a wavelength within the ultraviolet and visible spectral regions. Suitable sources of radiation include mercury, xenon, carbon arc and tungsten filament lamps, sunlight, etc. Exposures may be from less than about 1 second to 10 minutes or more depending upon the amounts of particular polymerizable materials and photoinitiators being utilized and depending upon the radiation source and distance from the source and the thickness of the coating to be cured. The compositions may also be polymerized by exposure to electron beam irradiation. Generally speaking the dosage necessary is from less than 1 megarad to 100 megarad or more. Generally speaking the rate of polymerization increases with increasing amounts of photoinitiator at a given light exposure or irradiation. The rate of polymerization also increases with increasing light intensity or electron dosage.

The curing or photopolymerization of the coating compositions is a triggered reaction. Once the degradation of the photointiator to a cationic catalyst has begun by exposure to a radiation source, the curing or photopolymerization reaction proceeds and will continue after the radiation source is removed. The use of thermal energy during or after exposure to a radiation source, i.e., post cure thermally, will generally accelerate the curing reaction, and even a moderate increase in temperature may greatly accelerate cure rate.

The photocopolymerizable compositions of this invention can be useful as automotive finishes, can finishes, appliance finishes, business machine finishes, coil coating, house siding finishes, general metal finishes and the like. The compositions can also be used as adhesives, printing inks, casting and molding compounds, potting and encapsulating compounds, caulking and sealing compounds, impregnating and coating compounds and the like. The photocopolymerizable compositions are particularly suitable in a variety of applications in the fields of protective coatings and graphic arts due to their superior impact resistance and abrasion-resistance and adhesion to rigid, resilient and flexible substrates such as metal, plastic, rubber, glass, paper, wood, and ceramics.

The coating compositions were evaluated according to the following procedures:

Solvent Resistance (Double Acetone Rubs): a measure of the resistance of the cured film to attack by acetone in which a film coating surface was rubbed with an acetone soaked cheesecloth back and forth with hand pressure. A rub back and forth with hand pressure over the film coating surface with the acetone soaked cheesecloth was designated as one "double acetone rub". The effect that a certain number of double acetone rubs had on the film coating surface was reported by a number in parenthesis following the number of double acetone rubs. The rating system for evaluating acetone resistance for a given number of double acetone rubs was as follows:

Number in Parenthesis After Number of Rubs (1) No change in coating appearance.
(2) Scratched surface.
(3) Dulled, marred, some coating removed.
(4) Breaks in coating appearance.
(5) About one-half of the coating removed.

Pencil Hardness: pencil leads of increasing hardness values were forced against the film coating surface in a precisely defined manner as described in ASTM-D-3363-74 until one pencil lead marred the surface of the film coating. The surface hardness was considered as the hardest pencil grade which just failed to mar the film coating surface. The pencil leads in order of softest to hardest were reported as follows: 6B, 5B, 4B, 3B, 2B, B, HB, F, H, 2H, 3H, 4H, 5H, 6H, 7H, 8H, and 9H.

Crosshatch Adhesion: a lattice pattern with ten cuts in each direction was made in the coating film to the substrate and pressure-sensitive adhesive tape was applied over the lattice pattern and then removed. The adhesion was evaluated by comparison with descriptions and illustrations as more fully detailed in ASTM D 3359-78.

Forward Impact Resistance (Gardner Impact): a measure of the ability of a cured film coating to resist rupture from a falling weight. A Gardner Impact Tester Model IG-1120 using an eight pound dart was used to test film coatings cast and cured on steel panels. The dart was raised to a given height in inches and dropped onto the coated side of the coated steel panel. The inches times pounds, designated inch-pounds, absorbed by the film without rupturing was recorded as the films forward impact resistance.

Reverse Impact Resistance (Gardner Impact): a measure of the ability of a cured film coating to resist rupture from a falling weight. A Gardner Impact Tester Model IG-1120 using an eight pound dart was used to test film coatings cast and cured on steel panels. The dart was raised to a given height in inches and dropped onto the uncoated side of the coated steel panel. The inches times pounds, designated inch-pounds, absorbed by the film without rupturing was recorded as the films reverse impact resistance.

Moisture Resistance: the cured film coating was immersed in water for a specified period of time and at a specified temperature. After removal from the water, the hydrolytic resistance of the cured film coating was determined by the pencil hardness test and the crosshatch adhesion test described hereinabove. Results obtained were compared with the results of identical tests performed on cured film coatings not immersed in water to determine moisture resistance.

The following examples are illustrative of the present invention and are not intended as a limitation upon the scope thereof. As used in the examples appearing hereinafter, the following designations, terms and abbreviations have the indicated meanings:
cps: centipoise
in/lbs.: inch/pounds
°C.: Centigrade degree
°F.: Fahrenheit degree
Hr.: hour
%: percent by weight unless otherwise specified.
Numbered Examples: examples which illustrate this invention.
Lettered Examples: comparative examples which do not illustrate this invention.
Epoxy/OH Eq. Wt. Ratio: The ratio of the equivalent weight of epoxide to the total hydroxyl equivalent weight of polyol.
Epoxide I: 3,4-Epoxycyclohexylmethyl-3,4-epoxycyclohexane carboxylate commercially available from Union Carbide Corporation as ERL-4221.
Polymer/Polyol I: A polymer/polyol based on a propylene oxide polyol that contains 10 percent polyacrylonitrile in a dispersed solid phase; having an average equivalent weight of 2440, an average hydroxyl number of 23 and commercially available from Union Carbide Corporation as NIAX Polymer Polyol 31-23.
Polymer/Polyol II: A polymer/polyol based on a propylene oxide polyol that contains 21 percent of a styrene/acrylonitrile copolymer in a dispersed solid phase; having an average equivalent weight of 2004, an average hydroxyl number of 28 and commercially available from Union Carbide Corporation as NIAX Polymer Polyol 34-28.
Photoinitiator I: A solution of a triarylsulfonium hexafluorophosphate having a specific gravity of 1.33 at 23° C., and a Brookfield viscosity of 40,000–60,000 centipoise (#4 spindle of 6 rpm, 23° C.) and commercially available from the 3M Company as FC-508.
Photoinitiator II: A solution of a triarylsulfonium hexafluoroantimony salt having a specific gravity of 1.39, a Brookfield viscosity of 74 centipoise at 25° C. and commercially available from General Electric Company as UVE-1014.
Surfactant I: A silicone composition having the following structure

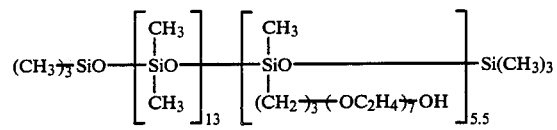

and commercially available from Union Carbide Corporation as L-5410.
Reactive Diluent I: 4-Vinyl cyclohexene monoepoxide.

EXAMPLES 1 THROUGH 48

Into brown glass bottles under a yellow light source was added Epoxide I, Polymer/Polyol I, Polymer/Polyol II, Reactive Diluent I, Photoinitiator I, Photoinitiator II and Surfactant I in the amounts specified in each example in Table I below. The contents in the bottles were thoroughly blended until homogeneous by simple stirring at ambient temperature. The viscosity of the resulting blends prepared in each example was then determined with a Brookfield viscometer at ambient temperature. The viscosity results are given in Table I.

TABLE I

| Example | 1 | 2 | 3 | 4 | 5 | 6 |
|---|---|---|---|---|---|---|
| Ingredients, grams | | | | | | |
| Epoxide I | 79.0 | 73.6 | 70.4 | 66.1 | 73.6 | 66.1 |
| Polymer/Polyol I | 16.5 | 21.9 | 25.1 | 29.4 | 21.9 | 29.4 |
| Polymer/Polyol II | 0 | 0 | 0 | 0 | 0 | 0 |
| Reactive Diluent I | 0 | 0 | 0 | 0 | 0 | 0 |
| Photoinitiator I | 4.0 | 4.0 | 4.0 | 4.0 | 0 | 0 |
| Photoinitiator II | 0 | 0 | 0 | 0 | 4.0 | 4.0 |
| Surfactant I | 0.5 | 0.5 | 0.5 | 0.5 | 0.5 | 0.5 |
| Properties | | | | | | |
| Viscosity, centipoise | 657 | 1032 | 1094 | 1217 | 888 | 1082 |
| Epoxy/OH Eq. Wt. Ratio | 85 | 60 | 50 | 40 | 60 | 40 |

| Example | 7 | 8 | 9 | 10 | 11 |
|---|---|---|---|---|---|
| Ingredients, grams | | | | | |
| Epoxide I | 79.9 | 73.9 | 69.9 | 64.2 | 73.9 |
| Polymer/Polyol I | 0 | 0 | 0 | 0 | 0 |
| Polymer/Polyol II | 15.6 | 21.6 | 25.6 | 31.3 | 21.6 |
| Reactive Diluent I | 0 | 0 | 0 | 0 | 0 |
| Photoinitiator I | 4.0 | 4.0 | 4.0 | 4.0 | 0 |
| Photoinitiator II | 0 | 0 | 0 | 0 | 4.0 |
| Surfactant I | 0.5 | 0.5 | 0.5 | 0.5 | 0.5 |
| Properties | | | | | |
| Viscosity, centipoise | 591 | 819 | 924 | 1090 | 864 |
| Epoxy/OH Eq. Wt. Ratio | 75 | 50 | 40 | 30 | 50 |

| Example | 12 | 13 | 14 | 15 | 16 |
|---|---|---|---|---|---|
| Ingredients, grams | | | | | |
| Epoxide I | 64.2 | 70.7 | 63.0 | 71.5 | 62.6 |
| Polymer/Polyol I | 0 | 14.8 | 22.5 | 0 | 0 |
| Polymer/Polyol II | 31.3 | 0 | 0 | 14.0 | 22.9 |
| Reactive Diluent I | 0 | 10.0 | 10.0 | 10.0 | 10.0 |
| Photoinitiator I | 0 | 0 | 0 | 0 | 0 |
| Photoinitiator II | 4.0 | 4.0 | 4.0 | 4.0 | 4.0 |
| Surfactant III | 0.5 | 0.5 | 0.5 | 0.5 | 0.5 |
| Properties | | | | | |
| Viscosity, centipoise | 1320 | 252 | 322 | 251 | 516 |
| Epoxy/OH Eq. Wt. Ratio | 30 | 98 | 59 | 86 | 47 |

Table I shows that the viscosity of the blend formulations containing Reactive Diluent I, i.e., Examples 13 through 16, is significantly lower than the viscosity of Examples 1 through 12 which do not contain Reactive Diluent I. The coating compositions of this invention may optionally contain Reactive Diluent I as an ingredient. The use of Reactive Diluent I in photocopolymerizable compositions based on epoxy and hydroxyl-containing organic materials is more fully described in copending U.S. patent application Ser. No. 464,571, filed on an even date herewith.

The blended formulations were then applied to Bonderite 37 ® treated steel panels using a Number 20 wirewound rod and cured with one pass under a 100 watt per inch, medium pressure, mercury lamp ultraviolet light source at 30 feet per minute. One Bonderite 37 ® treated steel panel coated with the specified blended formulation was prepared for each example. The cured coating on the Bonderite 37 ® treated steel panels of Examples 29 through 34 and Examples 45 and 46 was prepared from the blended formulations of Examples 7 through 12 and Examples 15 and 16 respectively. The cured coating on the Bonderite 37 ® treated steel panels of Examples 35 through 40 and Examples 47 and 48 was prepared from the blended formulations of Examples 7 through 12 and Examples 15 and 16 respectively. The cured coating on the Bonderite 37 ® treated steel panels of Examples 17 through 22 and Examples 41 and 42 was prepared from the blended formulations of Examples 1 through 6 and Examples 13 and 14 respectively. The cured coating on the Bonderite 37 ® treated steel panels of Examples 23 through 28 and Examples 43 and 44 was prepared from the blended formulations of Examples 1 through 6 and Examples 13 and 14 respectively. The thickness of the coatings varied from about 0.8 mils to about 0.9 mils. The cured coatings were tack free immediately after ultraviolet light irradiation. Specifically designated cured coatings in Table II below were not post cured thermally and other specifically designated cured coatings in Table II were post cured thermally at 170° C. for 10 minutes before testing for the properties designated in Table II. The results of the testing are given in Table II.

TABLE II

| Examples | 17 | 18 | 19 | 20 | 21 |
|---|---|---|---|---|---|
| Properties | | | | | |
| Double Acetone Rubs | 100(2) | 100(4) | 55(4) | 40(4) | 100(1) |
| Pencil Hardness | F | F | F | F | H |
| % Crosshatch Adhesion | 100 | 100 | 100 | 100 | 100 |
| Thermal Post cure | No | No | No | No | No |
| Gardner Impact, in. lbs. | | | | | |
| Forward | >320 | 150 | 225 | >320 | 150 |
| Reverse | >320 | 150 | 200 | 300 | 100 |
| Moisture Resistance | | | | | |
| 24 Hr. Water Immersion at Room Temperature | | | | | |
| Pencil Hardness | 5B | 4B | 3B | HB | 3B |
| % Crosshatch Adhesion | 100 | 100 | 50 | 100 | 0 |
| 3 Hr. Water Immersion at 130° F. | | | | | |
| Pencil Hardness | 2B | 5B | 5B | 3B | <5B |
| % Crosshatch Adhesion | 100 | 100 | 20 | 100 | 0 |

| Examples | 22 | 23 | 24 | 25 | 26 |
|---|---|---|---|---|---|
| Properties | | | | | |
| Double Acetone Rubs | 60(4) | 100(1) | 100(1) | 60(4) | 45(4) |
| Pencil Hardness | F | F | F | F | F |
| % Crosshatch Adhesion | 100 | 100 | 100 | 100 | 100 |
| Thermal Post cure | No | Yes | Yes | Yes | Yes |
| Gardner Impact, in. lbs. | | | | | |
| Forward | >320 | >320 | >320 | >320 | >320 |
| Reverse | >320 | >320 | >320 | >320 | >320 |
| Moisture Resistance | | | | | |
| 24 Hr. Water Immersion at Room Temperature | | | | | |
| Pencil Hardness | 2B | HB | 2B | HB | HB |
| % Crosshatch Adhesion | 0 | 100 | 100 | 100 | 100 |
| 3 Hr. Water Immersion at Room Temperature | | | | | |
| Pencil Hardness | 3B | F | HB | HB | HB |
| % Crosshatch Adhesion | 30 | 100 | 100 | 100 | 100 |

| Examples | 27 | 28 | 29 | 30 | 31 |
|---|---|---|---|---|---|
| Properties | | | | | |
| Double Acetone Rubs | 100(1) | 100(1) | 100(3) | 100(2) | 100(2) |
| Pencil Hardness | H | F | F | F | F |

TABLE II-continued

| Properties | | | | | |
|---|---|---|---|---|---|
| % Crosshatch Adhesion | 100 | 100 | 100 | 100 | 100 |
| Thermal Post cure | Yes | Yes | No | No | No |
| Gardner Impact, in. lbs. | | | | | |
| Forward | 300 | >320 | 225 | 125 | >320 |
| Reverse | 275 | >320 | 200 | 100 | 275 |
| Moisture Resistance | | | | | |
| 24 Hr. Water Immersion at Room Temperature | | | | | |
| Pencil Hardness | HB | HB | 2B | 3B | 4B |
| % Crosshatch Adhesion | 100 | 100 | 100 | 100 | 100 |
| 3 Hr. Water Immersion at Room Temperature | | | | | |
| Pencil Hardness | HB | HB | 3B | HB | 2B |
| % Crosshatch Adhesion | 100 | 100 | 100 | 100 | 100 |

| Examples | 32 | 33 | 34 | 35 | 36 |
|---|---|---|---|---|---|
| Properties | | | | | |
| Double Acetone Rubs | 65(4) | 100(1) | 100(1) | 100(2) | 100(1) |
| Pencil Hardness | H | H | H | F | H |
| % Crosshatch Adhesion | 100 | 100 | 100 | 100 | 100 |
| Thermal Post cure | No | No | No | Yes | Yes |
| Gardner Impact, in. lbs. | | | | | |
| Forward | >320 | 175 | >320 | 50 | >320 |
| Reverse | >320 | 150 | >320 | 25 | >320 |
| Moisture Resistance | | | | | |
| 24 Hr. Water Immersion at Room Temperature | | | | | |
| Pencil Hardness | 4B | <5B | B | F | HB |
| % Crosshatch Adhesion | 100 | 0 | 0 | 100 | 100 |
| 3 Hr. Water Immersion at Room Temperature | | | | | |
| Pencil Hardness | F | <5B | B | F | HB |
| % Crosshatch Adhesion | 100 | 0 | 0 | 100 | 100 |

| Examples | 37 | 38 | 39 | 40 | 41 |
|---|---|---|---|---|---|
| Properties | | | | | |
| Double Acetone Rubs | 100(1) | 100(1) | 100(1) | 100(1) | 100(1) |
| Pencil Hardness | H | H | H | H | H |
| % Crosshatch Adhesion | 100 | 100 | 100 | 100 | 100 |
| Thermal Post cure | Yes | Yes | Yes | Yes | No |
| Gardner Impact, in. lbs. | | | | | |
| Forward | >320 | >320 | >320 | >320 | 40 |
| Reverse | >320 | >320 | 300 | >320 | 25 |
| Moisture Resistance | | | | | |
| 24 Hr. Water Immersion at Room Temperature | | | | | |
| Pencil Hardness | HB | HB | F | H | <5B |
| % Crosshatch Adhesion | 100 | 100 | 90 | 100 | 0 |
| 3 Hr. Water Immersion at 130° F. | | | | | |
| Pencil Hardness | HB | F | F | F | <5B |
| % Crosshatch Adhesion | 100 | 100 | 15 | 100 | 0 |

| Examples | 42 | 43 | 44 | 45 |
|---|---|---|---|---|
| Properties | | | | |
| Double Acetone Rubs | 70 | 100 | 100 | 100 |
| | (4) | (1) | (1) | (1) |
| Pencil Hardness | H | H | H | H |
| % Crosshatch Adhesion | 100 | 100 | 100 | 98 |
| Thermal Post Cure | No | Yes | Yes | No |
| Gardner Impact, in. lbs. | | | | |
| Forward | 150 | 150 | >320 | 15 |
| Reverse | 150 | 75 | >320 | <5 |
| Moisture Resistance | | | | |
| 24 Hr. Water Immersion at Room Temperature | | | | |
| Pencil Hardness | 2B | F | HB | 5B |
| % Crosshatch Adhesion | 0 | 100 | 100 | 0 |
| 3 Hr. Water Immersion at 130° F. | | | | |
| Pencil Hardness | 5B | F | F | <5B |
| % Crosshatch Adhesion | 0 | 100 | 100 | 0 |

| Examples | 46 | 47 | 48 |
|---|---|---|---|
| Properties | | | |
| Double Acetone Rubs | 100 | 100 | 100 |
| | (1) | (1) | (1) |
| Pencil Hardness | H | H | H |
| % Crosshatch Adhesion | 100 | 100 | 100 |
| Thermal Post Cure | No | Yes | Yes |
| Gardner Impact, in. lbs. | | | |
| Forward | 25 | 125 | >320 |
| Reverse | <5 | 100 | >320 |
| Moisture Resistance | | | |
| 24 Hr. Water Immersion at Room Temperature | | | |
| Pencil Hardness | <5B | H | F |
| % Crosshatch Adhesion | 0 | 100 | 100 |
| 3 Hr. Water Immersion at 130° F. | | | |
| Pencil Hardness | <5B | H | F |
| % Crosshatch Adhesion | 0 | 15 | 80 |

Table II shows the properties of cured coatings which were prepared from blend formulations containing Polymer/Polyol I or Polymer/Polyol II. Even though both Polymer/Polyol I and Polymer/Polyol II have an opaque appearance, the resulting coating compositions containing these polymer/polyols cured very well and provided cured film coatings having a clear appearance. No evidence of polymer particles was observed in the cured film coatings when viewed with a low power lens (2.5×). The coating systems utilizing Photoinitiator I exhibit good water resistance without a post thermal cure. The blended coating formulations containing Polymer/Polyol I appeared to be stable and did not exhibit an increase in viscosity with time. The blended coating formulations containing Polymer/Polyol II showed an increase in viscosity with time. It is believed that swelling of the polymer particles caused the increase in viscosity. Coating systems containing Polymer/Polyol II are therefore desirable as two-package systems. The high viscosity blended formulations may also be desirable for certain purposes, for example, they can have utility in the high build coating area, printing operations and as casting compounds. Reactive Diluent I is effective in reducing the viscosity of these blended formulations.

I claim:

1. A photocopolymerizable composition comprising:
   (a) an epoxide containing two or more epoxy groups,
   (b) a polymer-polyol dispersion prepared by the free radical polymerization of acrylonitrile or a mixture of acrylonitrile and styrene in an organic polyol, said polyol being a polyoxyalkylene polyol containing unsaturation, and
   (c) at least one aromatic onium salt photoinitiator.

2. A photocopolymerizable composition as defined in claim 1 wherein the epoxide containing two or more epoxy groups is a cycloaliphatic epoxide.

3. A photocopolymerizable composition as defined in claim 2 wherein the cycloaliphatic epoxide has the formula:

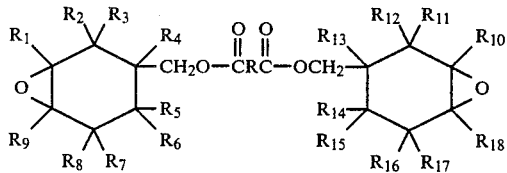

wherein $R_1$ through $R_{18}$, which can be the same or different, are hydrogen or alkyl radicals generally containing one to nine carbon atoms inclusive; R is a valence bond or a divalent hydrocarbon radical generally containing one to twenty carbon atoms inclusive.

4. A photocopolymerizable composition as defined in claim 2 wherein the cycloaliphatic epoxide has the formula:

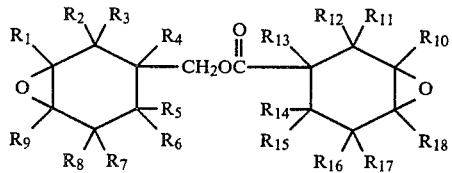

wherein $R^1$ through $R^{18}$, which can be the same or different, are hydrogen or alkyl radicals generally containing one to nine carbon atoms inclusive.

5. A photocopolymerizable composition as defined in claim 2 wherein the cycloaliphatic epoxide has the formula:

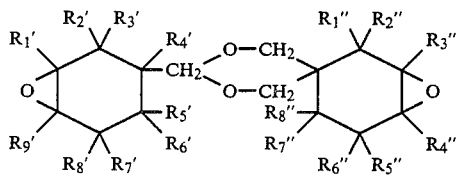

wherein the R prime and double prime groups are the same or different and are monovalent substituents or monovalent hydrocarbon radicals.

6. A photocopolymerizable composition as defined in claim 2 wherein the cycloaliphatic epoxide is 3,4-epoxycyclohexylmethyl-3,4-epoxycyclohexane carboxylate.

7. A photocopolymerizable composition as defined in claim 2 wherein the cycloaliphatic epoxide is bis(3,4-epoxycyclohexylmethyl)adipate.

8. A photocopolymerizable composition as defined in claim 2 wherein the cycloaliphatic epoxide is 2-(3,4-epoxycyclohexyl-5,5-spiro-3,4-epoxy)cyclohexane-meta-dioxane.

9. A photocopolymerizable composition as defined in claim 2 wherein the cycloaliphatic epoxide is a mixture of bis(3,4-epoxycyclohexylmethyl)adipate and 2-(3,4-epoxycyclohexyl-5,5-spiro-3,4-epoxy)cyclohexane-meta-dioxane.

10. A photocopolymerizable composition as defined in claim 2 wherein the cycloaliphatic epoxide is a mixture of 3,4-epoxycyclohexylmethyl-3,4-epoxycyclohexane carboxylate and bis(3,4-epoxycyclohexylmethyl)adipate.

11. A photocopolymerizable composition as defined in claim 10 which includes 2-(3,4-epoxycyclohexyl)-5,5-spiro-3,4-epoxy)cyclohexane-meta-dioxane.

12. A photocopolymerizable composition as defined in claim 2 which contains minor amounts of one or more glycidyl type epoxides, epoxy cresol novolac resins, epoxy phenol novolac resins, poly-nuclear phenol-glycidyl ether-derived resins, aromatic and heterocyclic glycidyl amine resins or hydantoin epoxy resins.

13. A photocopolymerizable composition as defined in claim 2 wherein the cycloaliphatic epoxide is a mixture of at least two cycloaliphatic epoxides.

14. A photocopolymerizable composition as defined as claim 1 wherein the polyol comprises an alkylene oxide adduct of a polyhydroxyalkane.

15. A photocopolymerizable composition as defined in claim 1 wherein the polymer-polyol dispersion is a mixture of at least two different polymer-polyol dispersions.

16. A photocopolymerizable composition as defined in claim 1 further comprising a minor amount of an organic polyol which is different from the polymer-polyol dispersion.

17. A photocopolymerizable composition as defined in claim 1 further comprising a substituted cycloaliphatic monoepoxide selected from the group consisting of cycloaliphatic monoepoxides substituted with alkyl of 1 to 9 carbon atoms, halogen, ether, ester, or vinyl radicals.

18. A photocopolymerizable composition as defined in claim 17 wherein the substituted cycloaliphatic monoepoxide is selected from the group consisting of 4-vinyl cyclohexene monoepoxide, norbornene monoepoxide and limonene monoepoxide.

19. A photocopolymerizable composition as defined in claim 17 wherein the substituted cycloaliphatic monoepoxide is 4-vinyl cyclohexene monoepoxide.

20. A photocopolymerizable composition as defined in claim 1 further comprising a surfactant.

21. A process for preparing a cured film coating comprising:
   (1) mixing until homogeneous a photocopolymerizable composition comprising an epoxide containing two or more epoxy groups, a polymer-polyol dispersion prepared by the free radical polymerization of acrylonitrile or a mixture of acrylonitrile and styrene in an organic polyol, said polyol being a polyoxyalkylene polyol containing unsaturation, and at least one aromatic onium salt photoinitiator;

(2) applying the homogeneous photocopolymerizable composition as a film coating on a suitable surface or substrate; and (3) exposing the film coating to actinic irradiation at a wavelength within the ultraviolet and visible spectral regions or electron beam irradiation for a period of time sufficient to cure the film coating.

22. The cured film coating of claim 21.

23. A photocopolymerizable composition as defined in claim 1, wherein the polyol is an alkylene oxide adduct of a trihydroxyalkane derived from an alkylene oxide selected from the group consisting of ethylene oxide, propylene oxide, butylene oxide and mixtures thereof.

* * * * *